(12) United States Patent
Wang et al.

(10) Patent No.: US 11,177,134 B2
(45) Date of Patent: Nov. 16, 2021

(54) CONDUCTIVE PATTERN AND METHOD FOR MANUFACTURING THE SAME, THIN FILM TRANSISTOR, DISPLAY SUBSTRATE, AND DISPLAY DEVICE

(71) Applicant: BOE TECHNOLOGY GROUP CO., LTD., Beijing (CN)

(72) Inventors: Jianguo Wang, Beijing (CN); Zhanfeng Cao, Beijing (CN); Haixu Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 54 days.

(21) Appl. No.: 16/424,694

(22) Filed: May 29, 2019

(65) Prior Publication Data

US 2020/0168461 A1    May 28, 2020

(30) Foreign Application Priority Data

Nov. 23, 2018  (CN) .......................... 201811406097.0

(51) Int. Cl.
*H01L 21/285*  (2006.01)
*C23C 14/18*  (2006.01)
(Continued)

(52) U.S. Cl.
CPC ........ *H01L 21/2855* (2013.01); *C23C 14/025* (2013.01); *C23C 14/042* (2013.01); *C23C 14/18* (2013.01); *C23C 14/5873* (2013.01); *H01L 21/32139* (2013.01); *H01L 21/76885* (2013.01); *H01L 23/49* (2013.01); *H01L 23/53238* (2013.01); *H01L 23/562* (2013.01);
(Continued)

(58) Field of Classification Search
None
See application file for complete search history.

(56) References Cited

U.S. PATENT DOCUMENTS

2008/0245549 A1    10/2008  Kodani et al.
2010/0163968 A1*   7/2010  Kim .................. H01L 27/11565
                                                257/324
(Continued)

FOREIGN PATENT DOCUMENTS

CN          101286457 A       10/2008
CN          104091821 A       10/2014
(Continued)

OTHER PUBLICATIONS

First Chinese Office Action dated Mar. 23, 2020, received for corresponding Chinese Application No. 201811406097.0, 14 pages.

*Primary Examiner* — Steven M Christopher
(74) *Attorney, Agent, or Firm* — Kinney & Lange, P.A.

(57) ABSTRACT

A conductive pattern and a method for manufacturing the same, a thin film transistor, a display substrate and a display device are provided. The method includes: step A, forming a metal layer on a base substrate; step B, forming a first conductive buffer layer on the metal layer; step C, patterning the metal layer and the first conductive buffer layer to form a conductive sub-pattern; and performing steps A to C repeatedly for N times to form N conductive sub-patterns that are stacked on the base substrate. The conductive pattern comprises the N conductive sub-patterns, and N is a positive integer greater than 1.

5 Claims, 4 Drawing Sheets

(51) Int. Cl.
    *H01L 23/00*     (2006.01)
    *H01L 27/12*     (2006.01)
    *H01L 29/45*     (2006.01)
    *H01L 29/49*     (2006.01)
    *C23C 14/04*     (2006.01)
    *C23C 14/02*     (2006.01)
    *H01L 29/40*     (2006.01)
    *C23C 14/58*     (2006.01)
    *H01L 21/3213*     (2006.01)
    *H01L 21/768*     (2006.01)
    *H01L 23/49*     (2006.01)
    *H01L 23/532*     (2006.01)
    *H01L 29/423*     (2006.01)

(52) U.S. Cl.
    CPC ........ *H01L 27/124* (2013.01); *H01L 27/1244* (2013.01); *H01L 27/1288* (2013.01); *H01L 29/401* (2013.01); *H01L 29/42376* (2013.01); *H01L 29/45* (2013.01); *H01L 29/458* (2013.01); *H01L 29/4908* (2013.01)

(56) References Cited

U.S. PATENT DOCUMENTS

2014/0127912 A1*   5/2014   Wu ................... H01J 37/32697
                                                                                          438/758
2015/0155313 A1    6/2015   Yamazaki et al.
2018/0212043 A1*   7/2018   Sun ..................... H01L 21/3081

FOREIGN PATENT DOCUMENTS

| | | | |
|---|---|---|---|
| CN | 105793994 | A | 7/2016 |
| CN | 108242276 | A | 7/2018 |
| JP | 5023114 | B2 * | 9/2012 |

* cited by examiner

CONDUCTIVE PATTERN AND METHOD FOR MANUFACTURING THE SAME, THIN FILM TRANSISTOR, DISPLAY SUBSTRATE, AND DISPLAY DEVICE

CROSS-REFERENCE TO RELATED APPLICATION

The present application claims a priority to Chinese Patent Application No. 201811406097.0 filed on Nov. 23, 2018, the disclosure of which is incorporated in its entirety by reference herein.

TECHNICAL FIELD

The present disclosure relates to the field of display technology, and in particular to a conductive pattern and a method for manufacturing the same, a thin film transistor, a display substrate, and a display device.

BACKGROUND

With the increasing size of a liquid crystal display (LCD) and an organic light emitting diode (OLED) display product, for achieving a higher refresh frequency, a higher resolution and a higher aperture ratio, an increasing demand is proposed for a sputtering technology for thick copper wires with low resistances.

However, when copper thin films are formed on a base substrate through a sputtering process, a large stress is generated, which adversely affects a performance and a product yield of a display substrate.

SUMMARY

In a first aspect, an embodiment of the present disclosure provides a method for manufacturing a conductive pattern, and the method includes:
providing a base substrate;
step A, forming a metal layer;
step B, forming a first conductive buffer layer on the metal layer;
step C, patterning the metal layer and the first conductive buffer layer to form a conductive sub-pattern; and
performing steps A to C repeatedly for N times to form N conductive sub-patterns that are stacked on the base substrate, where the conductive pattern includes the N conductive sub-patterns, and N is a positive integer greater than 1.

In some optional embodiments, an orthographic projection of the n-th formed conductive sub-pattern onto the base substrate falls within an orthographic projection of the (n−1)-th formed conductive sub-pattern onto the base substrate, and n is a positive integer greater than 1, and smaller than or equal to N.

In some optional embodiments, the step A includes: forming the metal layer by a sputtering process using Cu.

In some optional embodiments, prior to the step A, the method further includes: forming a second conductive buffer layer on the base substrate, where the second conductive buffer layer is below a first conductive sub-pattern of the N conductive sub-patterns, and the first conductive sub-pattern is closest to the base substrate than other conductive sub-patterns of the N conductive sub-patterns.

In some optional embodiments, the step B includes: forming the first conductive buffer layer using at least one of Mo, MoTi, MoNb, MoAl, MoSb, MoW, MoNi, MoNbSn or MoNiTi.

In some optional embodiments, the forming the second conductive buffer layer includes: forming the second conductive buffer layer using at least one of Mo, MoTi, MoNb, MoAl, MoSb, MoW, MoNi, MoNbSn or MoNiTi.

In some optional embodiments, the step C includes: coating a photoresist on the first conductive buffer layer, exposing the photoresist using a mask plate, and developing to form the conductive sub-pattern.

In a second aspect, an embodiment of the present disclosure further provides a conductive pattern, and the conductive pattern includes a base substrate and N conductive sub-patterns stacked on the base substrate, where each of the N conductive sub-patterns includes a metal layer and a first conductive buffer layer, the first conductive buffer layer is on a side of the metal layer away from the base substrate, and N is a positive integer greater than 1.

In some optional embodiments, the N conductive sub-patterns are sequentially numbered along a direction in which the N conductive sub-patterns are away from the base substrate, an orthographic projection of the n-th conductive sub-pattern onto the base substrate fall within an orthographic projection of the (n−1)-th conductive sub-pattern onto the base substrate, and n is a positive integer greater than 1, and smaller than or equal to N.

In some optional embodiments, an orthographic projection of the metal layer of each of the N conductive sub-patterns onto the base substrate basically coincides with an orthographic projection of the first conductive buffer layer of the conductive sub-pattern onto the base substrate.

In some optional embodiments, each metal layer is made of Cu through a sputtering process.

In some optional embodiments, a thickness of each metal layer ranges from 1 um to 3 um.

In some optional embodiments, the conductive pattern further includes a second conductive buffer layer between the base substrate and a first conductive sub-pattern of the N conductive sub-patterns.

In some optional embodiments, a thickness of the first conductive buffer layer ranges from 100 angstroms to 1000 angstroms.

In some optional embodiments, the first conductive buffer layer is made of at least one of Mo, MoTi, MoNb, MoAl, MoSb, MoW, MoNi, MoNbSn, or MoNiTi.

In some optional embodiments, the second conductive buffer layer is made of at least one of Mo, MoTi, MoNb, MoAl, MoSb, MoW, MoNi, MoNbSn, or MoNiTi.

In a third aspect, an embodiment of the present disclosure further provides a thin film transistor, and at least one electrode of the thin film transistor includes the conductive pattern described in the above second aspect.

In a fourth aspect, an embodiment of the present disclosure further provides a display substrate, and the display substrate includes: a first base substrate, and the conductive pattern described in the above second aspect on the first base substrate, where the conductive pattern is used to form at least one of an electrode or a signal wire of the display substrate.

In some optional embodiments, different conductive sub-patterns in the conductive pattern are used to form different electrodes or different signal wires.

In a fifth aspect, an embodiment of the present disclosure further provides a display device, which includes the display substrate described in the above fourth aspect and a circuit board.

DETAILED DESCRIPTION OF THE EMBODIMENTS

In order to make technical problems, technical solutions and advantages to be solved in embodiments of the present disclosure clearer, specific embodiments will be described in detail hereinafter in conjunction with drawings.

In a sputtering process for a thick copper, a stress of a copper thin film increases with an increase of a thickness of a sputtered copper, and correspondingly, a bending degree of a base substrate below the sputtered copper is increased, thereby leading to an alarm of a manufacturing equipment or breakage of the base substrate, and thus adversely affecting a performance and a product yield of a display substrate.

The embodiments of the present disclosure provide a conductive pattern and a method for manufacturing the conductive pattern, a thin film transistor, a display substrate and a display device, which can improve the product yield of the display substrate while realizing a low-resistance conductive pattern.

Figure 1:
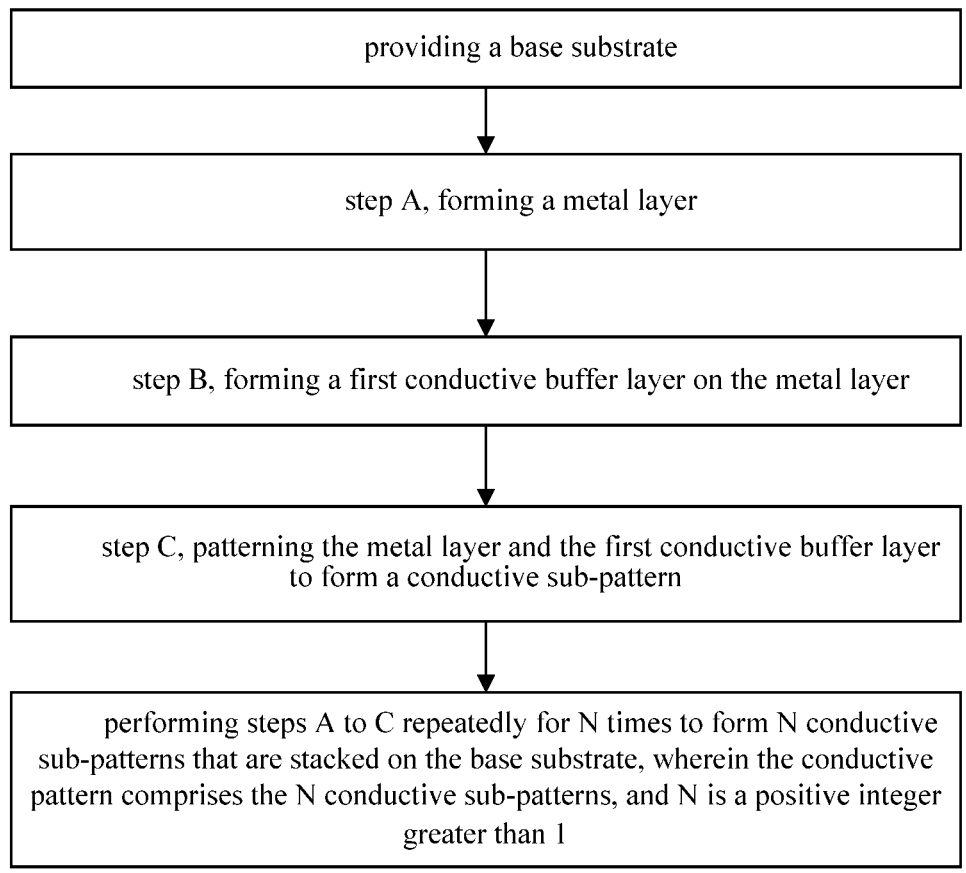
FIG. 1 is a flow chart of a method for manufacturing a conductive pattern according to an embodiment of the present disclosure.

An embodiment of the present disclosure provides a method for manufacturing a conductive pattern, as shown in FIG. 1, and the method includes:

providing a base substrate;

step A, forming a metal layer;

step B, forming a first conductive buffer layer on the metal layer;

step C, patterning the metal layer and the first conductive buffer layer to form a conductive sub-pattern; and performing steps A to C repeatedly for N times to form N conductive sub-patterns that are stacked on the base substrate, where the conductive pattern includes the N conductive sub-patterns, and N is a positive integer greater than 1.

In the embodiment, one conductive sub-pattern is formed in one patterning process, and multiple conductive sub-patterns are formed through multiple patterning processes to form the conductive pattern. Since the conductive pattern is composed of multiple conductive sub-patterns that are stacked, the conductive pattern has a large thickness and a low resistance. Since a stress of the metal layer can be completely released after etching, even if the metal layer has more than two layers, a stress of only one metal layer is acting on the base substrate, and the base substrate may not be greatly bent, thus improving a product yield while realizing a low-resistance conductive pattern. In addition, the first conductive buffer layer is added between any two adjacent metal layers, and the first conductive buffer layer is able to protect the metal layer from being oxidized, and increase an adhesion force between each two adjacent metal layers, so as to avoid a gap appearing between each two adjacent metal layers.

In some optional embodiments, an orthographic projection of the conductive sub-pattern formed in the n-th time on the base substrate falls within an orthographic projection of the conductive sub-pattern formed in the (n−1)-th time on the base substrate, and n is a positive integer greater than 1, and smaller than or equal to N.

In some optional embodiments, step A includes: forming the metal layer by a copper sputtering process. A stress is generated during forming the copper metal film by sputtering copper in step A, while forming the first conductive buffer layer in step B and patterning in step C can eliminate an internal stress of the copper metal film.

In some optional embodiments, before forming a first metal layer, the method further includes: forming a second conductive buffer layer on the base substrate, where the first metal layer is located on the second conductive buffer layer. The second conductive buffer layer is able to increase an adhesion force between the metal layer and the base substrate, and the second conductive buffer layer and the first conductive buffer layer are made of a same material or different materials.

In some optional embodiments, step B includes: forming the first conductive buffer layer using at least one material of Mo, MoTi, MoNb, MoAl, MoSb, MoW, MoNi, MoNbSn or MoNiTi.

In some optional embodiments, step C includes: coating a photoresist on the first conductive buffer layer, exposing the photoresist using a mask plate, and removing the photoresist after development to form the conductive sub-pattern.

Figure 6:
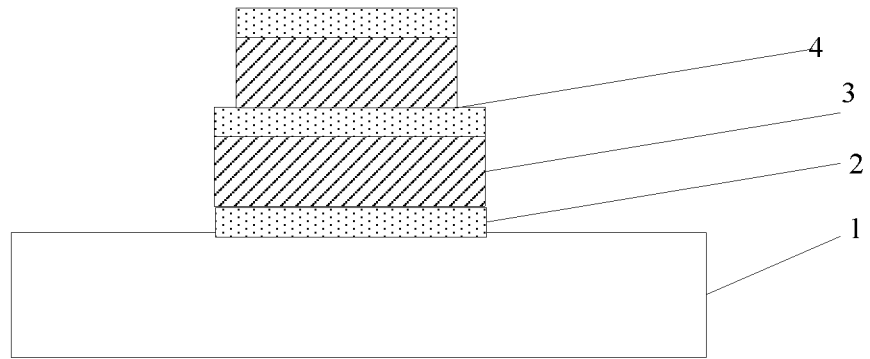
FIG. 6 is a schematic diagram of a two-layer conductive sub-pattern according to an embodiment of the present disclosure.
Figure 7:
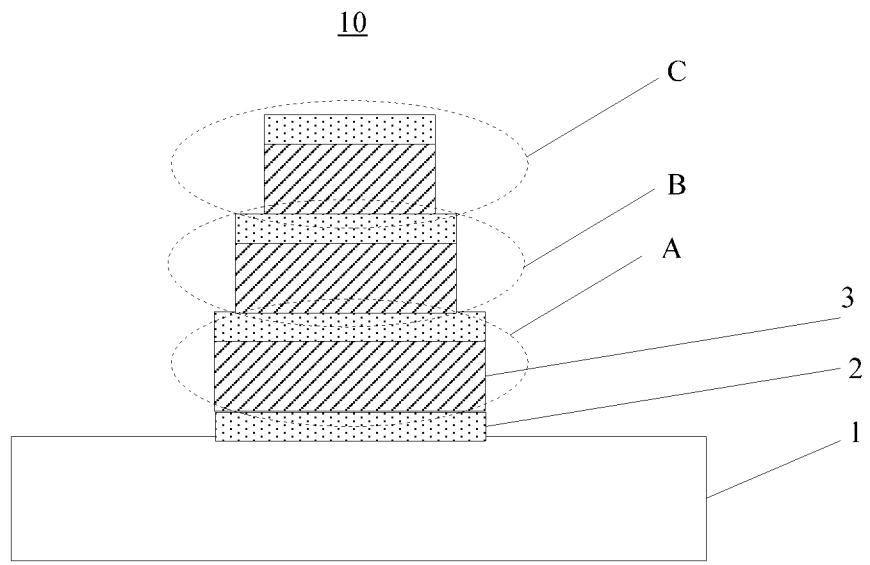
FIG. 7 is a schematic diagram of a three-layer conductive sub-pattern according to an embodiment of the present disclosure.

An embodiment of the present disclosure further provides a conductive pattern, which is manufactured using the method described above. As shown in FIGS. 6 and 7, a conductive pattern 10 includes a base substrate 1 and N conductive sub-patterns (for example, A, B and C, shown in FIG. 6) stacked on the base substrate, where each conductive sub-pattern includes a metal layer 3 and a first conductive buffer layer 4, the first conductive buffer layer 4 is located on a side of the metal layer 3 away from the base substrate 1, and N is a positive integer greater than 1.

Optionally, the N conductive sub-patterns are sequentially numbered along a direction in which the N conductive sub-patterns are away from the base substrate, an orthographic projection of the n-th formed conductive sub-pattern on the base substrate falls within an orthographic projection of the (n−1)-th formed conductive sub-pattern on the base substrate, and n is a positive integer greater than 1, and smaller than or equal to N.

In the embodiment, one conductive sub-pattern is formed through one patterning process, and multiple conductive sub-patterns are formed through multiple patterning processes to form the conductive pattern. Since the conductive pattern is composed of multiple conductive sub-patterns that are stacked, the conductive pattern has a large thickness and a low resistance. Additionally, since a stress of the metal layer can be completely released during etching, even if the conductive pattern includes multiple conductive sub-patterns, a stress of only one metal layer is acting on the base substrate, and the base substrate may not be greatly bent, thus improving a product yield while forming a low-resistance conductive pattern. In addition, the first conductive buffer layer is added between any two adjacent metal layers, and the first conductive buffer layer is able to protect the metal layer from being oxidized, and increase an adhesion force between each two adjacent metal layers, so as to avoid a gap appearing between each two adjacent metal layers.

As shown in FIG. 6, multiple conductive sub-patterns include a first conductive sub-pattern and a second conductive sub-pattern located on the first conductive sub-pattern, and an orthographic projection of the second conductive sub-pattern on a plane where the first conductive sub-pattern is located falls into the first conductive sub-pattern.

As Cu has a good conductivity and can meet the requirement of a low resistance, optionally, the metal layer is made of Cu.

In order to avoid generating an excessive stress during sputtering a metal layer, it is inappropriate to make a thickness of each metal layer too large. Optionally, the thickness of each metal layer ranges from 1 um to 3 um.

If the first conductive buffer layer is too thick, a stress may also occur in the process of forming a copper film through a sputtering process. Therefore, it is inappropriate to make the thickness of the first conductive buffer layer too large. Optionally, the thickness of the first conductive buffer layer ranges from 100 angstroms to 1000 angstroms.

The first conductive buffer layer is formed from a conductive material that is not easily oxidized and has good etching performance. Specifically, a material forming the first conductive buffer layer includes at least one of: Mo, MoTi, MoNb, MoAl, MoSb, MoW, MoNi, MoNbSn or MoNiTi.

The conductive pattern and the method for manufacturing the conductive pattern are further described below with reference to the drawings and specific embodiments.

Figure 2:
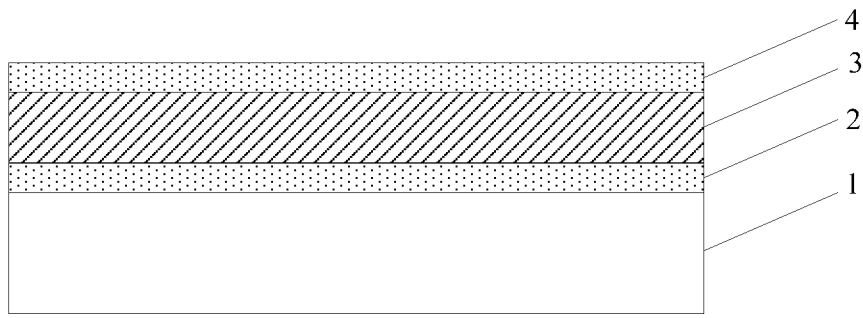
FIG. 2 is a schematic diagram showing a conductive pattern after a first conductive buffer layer, a metal layer and a second conductive buffer layer are formed on a base substrate according to an embodiment of the present disclosure.

As shown in FIG. 2, a base substrate 1 is provided, which may be a glass base substrate. A second conductive buffer layer 2 is formed on the base substrate 1. The second conductive buffer layer 2 is able to increase an adhesion force between a metal layer 3 and the base substrate 1. Specifically, the second conductive buffer layer 2 is formed of at least one of Mo, MoTi, MoNb, MoAl, MoB, MoW, MoNi, MoNbSn or MoNiTi, and a thickness of the second conductive buffer layer 2 ranges from 100 angstroms to 1000 angstroms.

The metal layer 3 is deposited on the second conductive buffer layer 2 by sputtering. Specifically, the metal layer 3 may be made of Cu, and a thickness of the metal layer 3 ranges from 1 um to 3 um. Since the thickness of the metal layer 3 is not large, when the metal layer 3 is formed by sputtering, too much stress may not be generated, which ensures the base substrate 1 not to be greatly bent.

A first conductive buffer layer 4 is formed on the metal layer 3. The first conductive buffer layer 4 can prevent a surface of the metal layer 3 from being contacting with air during the etching process, so as to prevent the metal layer 3 from being oxidized, and can increase an adhesion force with the metal layer 3 below, so as to avoid a gap appearing between adjacent metal layers. Specifically, the first conductive buffer layer 4 may be formed of at least one of Mo, MoTi, MoNb, MoAl, MoB, MoW, MoNi, MoNbSn, or MoNiTi, and a thickness of the first conductive buffer layer 4 may range from 100 angstroms to 1000 angstroms.

Figure 3:
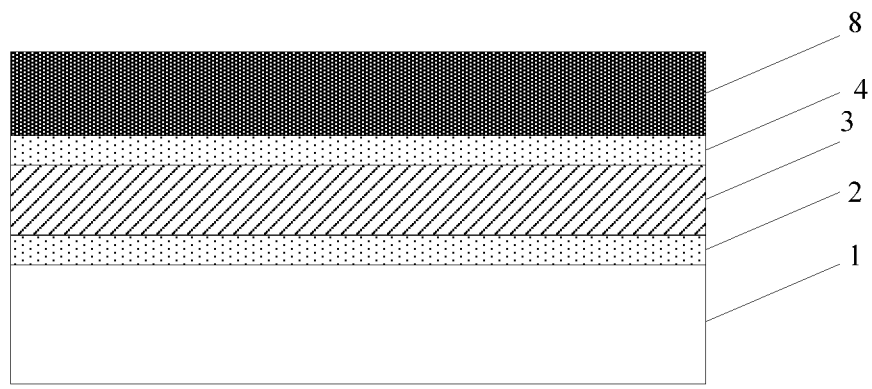
FIG. 3 is a schematic diagram of a conductive pattern after a photoresist is formed on a conductive buffer layer according to an embodiment of the present disclosure.

As shown in FIG. 3, a photoresist 8 is formed on the first conductive buffer layer 4.

Figure 4:
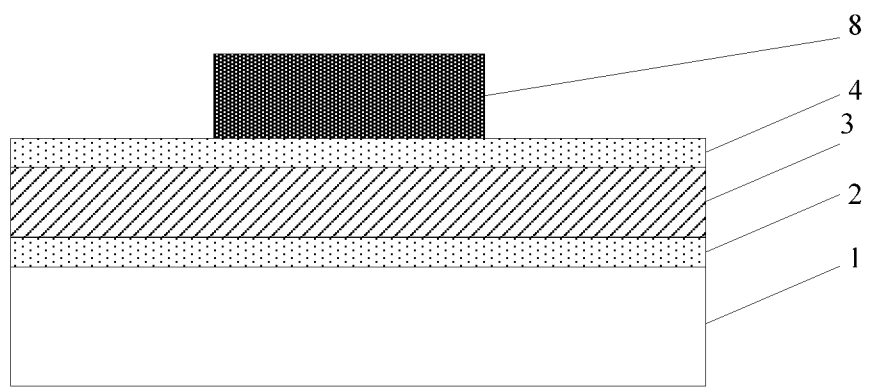
FIG. 4 is a schematic diagram of a conductive pattern after the photoresist is exposed and developed according to an embodiment of the present disclosure.

As shown in FIG. 4, the photoresist 8 is exposed and developed using a mask plate, and then a pattern of the photoresist 8 is formed.

Figure 5:
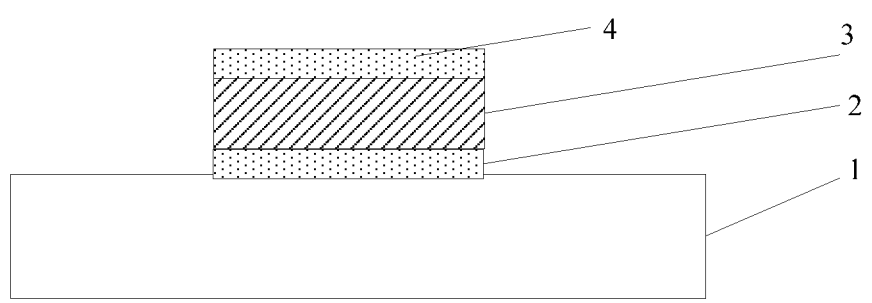
FIG. 5 is a schematic diagram of a conductive pattern after the conductive buffer layers and the metal layer are etched according to an embodiment of the present disclosure.

As shown in FIG. 5, the second conductive buffer layer 2, the metal layer 3 and the first conductive buffer layer 4 are etched using the pattern of the photoresist 8 as a mask to form a first conductive sub-pattern and the remaining photoresist is stripped.

As shown in FIG. 6, the above steps are repeated, a second metal layer is sputtered on the base substrate 1 on which the first conductive sub-pattern is formed, and the sputtered second metal layer has a thickness ranging from 1 um to 3 um. A first conductive buffer layer 4 is formed on the second metal layer, and the second metal layer and the first conductive buffer layer 4 are patterned to form a second conductive sub-pattern. An orthographic projection of the second conductive sub-pattern on the base substrate 1 falls within an orthographic projection of the first conductive sub-pattern on the base substrate 1.

If the second metal layer and the first conductive buffer layer 4 are patterned using a mask as same as that used for the first conductive sub-pattern, it is ensured that an orthographic projection of the second conductive sub-pattern on the base substrate 1 coincides with an orthographic projection of the first conductive sub-pattern on the base substrate 1. Since the first conductive buffer layer 4 is added between the first metal layer and the second metal layer, the first metal layer 3 may not oxidize, a gap may not appear between any adjacent metal layers, thereby improving an adhesion force between the adjacent metal layers. Two conductive sub-patterns form a conductive pattern of a thickness ranging from 2 um to 6 um.

As shown in FIGS. 6 and 7, an area of a mask plate (the pattern of the etched photoresist 8) of the second conductive sub-pattern is smaller than an area of a mask plate of the first conductive sub-pattern, and an area of a mask plate of the third conductive sub-pattern is smaller than an area of the mask plate of the second conductive sub-pattern. In this way, the areas of the N conductive sub-patterns are successively decreased in a direction in which the N conductive sub-patterns are away from the base substrate 1, which can further reduce the stress inside the conductive pattern and avoid a gap appearing between adjacent metal layers.

The above steps are performed repeatedly to form a third layer of conductive pattern. As shown in FIG. 7, a first conductive sub-pattern A, a second conductive sub-pattern B and a third conductive sub-pattern C may form a conductive pattern of a thickness ranging from 3 um to 9 um.

In a case that a conductive pattern of a larger thickness is required, a fourth conductive sub-pattern, a fifth conductive sub-pattern and the like can be further formed.

Since a stress of the metal layer 3 can be completely released after etching, even if the metal layer 3 has more than two layers, a stress of only one metal layer is acting on the base substrate 1, and the base substrate will not be greatly bent, thus improving a product yield while realizing a low-resistance conductive pattern. In addition, the first conductive buffer layer is added between the two layers of metal layer, and the first conductive buffer layer can protect the metal layer from being oxidized, and can increase an adhesion force between each two adjacent metal layer.

Figure 8:
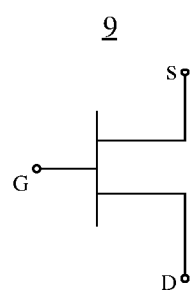
FIG. 8 is a schematic diagram of a thin film transistor according to an embodiment of the present disclosure.

An embodiment of the present disclosure further provides a thin film transistor, as shown in FIG. 8, and the thin film transistor includes three electrodes, a gate electrode G, a source electrode S and a drain electrode D, at least one of which adopts the conductive pattern as described above. In the embodiment, the thin film transistor of a low resistance is realized to improve the performance of the thin film transistor, and it is also ensured that the base substrate of the thin film transistor is not broken. Optionally, a gate electrode, a source electrode and a drain electrode of the thin film transistor are each formed using the conductive pattern as described above.

Figure 9:
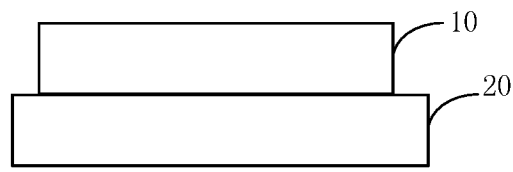
FIG. 9 is a schematic diagram of a display substrate according to an embodiment of the present disclosure.

An embodiment of the present disclosure provides a display substrate 100, as shown in FIG. 9, and the display substrate 100 includes: a first base substrate 20, and the conductive pattern 10 as described above formed on the first base substrate 20.

The conductive pattern may be an electrode of the display substrate or a signal wire of the display substrate. In the embodiment, the display substrate has a conductive pattern of a low resistance, so as to improve the performance of the display substrate, and it is ensured that the first base substrate of the display substrate is not broken.

In some optional embodiments, different conductive sub-patterns of the conductive pattern are used to form different electrodes or different signal wires.

Figure 10:
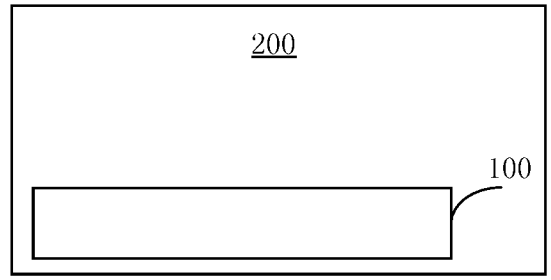
FIG. 10 is a schematic diagram of a display device according to an embodiment of the present disclosure.

An embodiment of the present disclosure further provides a display device, as shown in FIG. 10. The display device 200 includes the display substrate 100 described above. The display device can be any product or component with a display function such as a television, a display, a digital picture frame, a mobile phone, a tablet computer and the like, where the display device further includes a back plate, and a flexible printed circuit board or a printed circuit board.

Unless otherwise defined, technical terms or scientific terms used in the present disclosure should be interpreted according to common meanings thereof as commonly understood by those of ordinary skills in the art. Such terms as "first", "second" and the like used in the present disclosure do not represent any order, quantity or importance, but are merely used to distinguish different components. Such terms as "including", or "comprising" and the like mean that an element or an article preceding the term contains elements or items and equivalents thereof behind the term, but does not exclude other elements or items. Such terms as "connected", or "interconnected" and the like are not limited to physical or mechanical connections, but may include electrical connections, whether direct connection or indirect connection. Such terms as "on", "under", "left", "right" and the like are only used to represent a relative position relationship, and when an absolute position of a described object is changed, the relative position relationship thereof may also be changed accordingly.

It may be understood that when an element such as a layer, a film, a region or a substrate is referred to as being "on" or "under" another element, the element may be "directly" "on" or "under" the another element, or there may exist an intervening element.

The above embodiments are merely optional embodiments of the present disclosure. It should be noted that numerous improvements and modifications may be made by those skilled in the art without departing from the principle of the present disclosure, and these improvements and modifications shall also fall within the scope of the present disclosure.

What is claimed is:

1. A method for manufacturing a conductive pattern, comprising:
providing a base substrate;
step A: forming a metal layer;
step B: forming a first conductive buffer layer on the metal layer;
step C: patterning the metal layer and the first conductive buffer layer to form a conductive sub-pattern; and
performing steps A to C repeatedly for N times to form N conductive sub-patterns that are stacked on the base substrate, wherein the conductive pattern comprises the N conductive sub-patterns, and N is a positive integer greater than 1;
wherein an orthographic projection of the n-th formed conductive sub-pattern onto the base substrate falls within an orthographic projection of the (n−1)-th formed conductive sub-pattern onto the base substrate, and n is a positive integer greater than 1, and is smaller than or equal to N;
wherein the step A comprises:
forming the metal layer by a sputtering process using Cu;
wherein the step C comprises:
forming a photoresist on the first conductive buffer layer;
exposing and developing the photoresist using a mask plate, and then forming a pattern of the photoresist;
etching the second conductive buffer layer, the metal layer and the first conductive buffer layer using the pattern of the photoresist as a mask to form a first conductive sub-pattern and stripping the remaining photoresist;
sputtering a second metal layer on the base substrate on which the first conductive sub-pattern is formed;
further forming the first conductive buffer layer on the second metal layer; and
patterning the second metal layer and the first conductive buffer layer to form a second conductive sub-pattern;
wherein an area of a mask plate of the second conductive sub-pattern is smaller than an area of a mask plate of the first conductive sub-pattern.

2. The method according to claim 1, wherein prior to the step A, the method further comprises:
forming a second conductive buffer layer on the base substrate, wherein the second conductive buffer layer is below a first conductive sub-pattern of the N conductive sub-patterns, and the first conductive sub-pattern is closest to the base substrate relative to other conductive sub-patterns of the N conductive sub-patterns.

3. The method according to claim 1, wherein the step B comprises:
forming the first conductive buffer layer using at least one of Mo, MoTi, MoNb, MoAl, MoSb, MoW, MoNi, MoNbSn or MoNiTi.

4. The method according to claim 2, wherein the forming the second conductive buffer layer comprises:
forming the second conductive buffer layer using at least one of Mo, MoTi, MoNb, MoAl, MoSb, MoW, MoNi, MoNbSn or MoNiTi.

5. The method according to claim 1, wherein the step C comprises:
coating a photoresist on the first conductive buffer layer, exposing the photoresist using a mask plate, and developing to form the conductive sub-pattern.

* * * * *